(12) United States Patent
Ota et al.

(10) Patent No.: US 7,453,310 B2
(45) Date of Patent: Nov. 18, 2008

(54) SWITCHING CIRCUIT HAVING TWO MOS-FETS

(75) Inventors: Kingo Ota, Nukata-gun (JP); Shoichi Okuda, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 14 days.

(21) Appl. No.: 11/500,301

(22) Filed: Aug. 8, 2006

(65) Prior Publication Data
US 2007/0063747 A1    Mar. 22, 2007

(30) Foreign Application Priority Data
Sep. 20, 2005  (JP)  ............................. 2005-272099
Mar. 6, 2006  (JP)  ............................. 2006-059376

(51) Int. Cl.
*H03K 17/06* (2006.01)
(52) U.S. Cl. ...................... 327/379; 327/381; 327/383
(58) Field of Classification Search ........................ None
See application file for complete search history.

(56) References Cited

U.S. PATENT DOCUMENTS 5,550,497 A * 8/1996 Carobolante ................ 327/110
6,304,208 B1  10/2001 Nagashima ................. 341/163
6,768,228 B1 * 7/2004 Fial et al. ..................... 307/131

FOREIGN PATENT DOCUMENTS

JP    A-6-97428    4/1994
JP    A-2002-43434    2/2002

* cited by examiner

*Primary Examiner*—An T Luu
(74) *Attorney, Agent, or Firm*—Posz Law Group, PLC

(57) ABSTRACT

A switching circuit of the present invention can be advantageously used in an electronic control unit mounted on an automotive vehicle. The switching circuit is constituted by a pair of P-channel MOS-FETs connected in series between an input terminal and an output terminal. Sources of both MOS-FETs are connected to a common source junction and gates thereof are connected to a common gate junction. A Zener diode connected between the common source junction and the common gate junction is used for protecting the MOS-FETs. A resistor is connected in parallel to the Zener diode to bring the switching circuit to a non-conductive state when the gate voltage at the common gate junction becomes indefinite and a high voltage is supplied to the output terminal. In place of the resistor, an additional P-channel MOS-FET may be used in the switching circuit to bring the switching circuit to the non-conductive state when the voltage at the common gate junction becomes indefinite.

1 Claim, 2 Drawing Sheets

SWITCHING CIRCUIT HAVING TWO MOS-FETS

CROSS-REFERENCE TO RELATED APPLICATIONS

This application is based upon and claims benefit of priority of Japanese Patent Applications No. 2005-272099 filed on Sep. 20, 2005 and No. 2006-59376 filed on Mar. 6, 2006, the contents of which are incorporated herein by reference.

BACKGROUND OF THE INVENTION

1. Field of the Invention

The present invention relates to a switching circuit having two P-channel MOS-FETs connected in series.

2. Description of Related Art

A switching circuit for switching a low current under a high voltage can be constituted by MOS-FETs (Metal Oxide Semiconductor Field Effect Transistors). It is often preferable to form such a switching circuit by using only. P-channel MOS-FETs or N-channel MOS-FETs to simplify the manufacturing process.

FIG. 3 shows a conventional switching circuit 6 in which two P-channel MOS-FETs are used. A first P-channel MOS-FET 1 and a second P-channel MOS-FET 2 are connected in series. Sources of both MOS-FETs are connected to a common source junction Js, and gates of both MOS-FETs are connected to a common gate junction Jg. In this case, cathodes of parasitic diodes 3, 4 formed between a drain and a source of each MOS-FET are commonly connected to the source junction Js. Namely, both parasitic diodes 3, 4 are connected in a reverse direction to each other, in order to prevent a reverse current that flows from an OUTPUT side to an INPUT side through the parasitic diode 4 when only the second MOS-FET 2 is used. An example of an analog switch which is similar to the switching circuit shown in FIG. 3 is disclosed in JP-A-2002-43434.

When a switching circuit such as the circuit shown in FIG. 3 is used in an electronic control unit (ECU) mounted on an automotive vehicle, a maximum signal level given to an input side will be 12-14 volts corresponding to a battery voltage. Assuming that a gate voltage of the EFT 1 and EFT 2 is controlled in a range of 5-0 volts and that a withstanding gate voltage is 8 volts, it is proper to set a Zener voltage to 8 volts.

However, in the switching circuit shown in FIG. 3 following problems are involved. When the gate becomes open, due to disconnection of a lead wire controlling the gate voltage, for example, and the On-Off control of the switching circuit 6 becomes impossible to be performed, it is preferable to keep the circuit in an Off state from a safety standpoint. If the input side is at zero volt and a voltage such as 16 volts is imposed on the output side, a voltage is imposed on a source of FET 2 through the parasitic diode 4. Assuming that a forward voltage of the parasitic diode 4 is 0.8 volts, the source voltage of the FET 2 becomes 15.2 volts. The gate voltage at the gate junction Jg is set to 7.2 volts (15.2−8) through the Zener diode 5. Accordingly, both of the FETs 1 and 2 are turned on by a potential difference between the gate and the source, and the switching circuit 6 is brought to a conductive state. JP-A-2002-43434 mentioned above does not touch upon this problem at all because the structure of the switching circuit is different from that shown in FIG. 3 though MOS-FETs are used.

SUMMARY OF THE INVENTION

The present invention has been made in view of the above-mentioned problem, and an object of the present invention is to provide an improved switching circuit in which its non-conductive state is surely kept when a gate voltage becomes indefinite.

The switching circuit according to the present invention is advantageously used in an electronic control unit mounted on an automobile vehicle. The switching circuit includes a first P-channel MOS-FET and a second P-channel MOS-FET, both connected in series between an input terminal and an output terminal. Parasitic diodes are included in both P-channel MOS-FETs. In the switching circuit, sources of both P-channel MOS-FETs are connected to a common source junction, and the gates thereof are connected to a common gate junction. By connecting both P-channel MOS-FETs in this manner, cathodes of parasitic diodes are also connected to the common source junction. A Zener diode for protecting the P-channel MOS-FETs is connected between the common source junction and the common gate junction, and a resistor is connected in parallel to the Zener diode.

When a gate voltage at the common gate junction becomes indefinite for some reasons, such as disconnection of a lead wire supplying the gate voltage, while a high voltage is supplied to the output terminal and a low voltage is supplied to the input terminal, the voltages at the source junction and the gate junction become equal through the resistor connected in parallel to the Zener diode. Thereby, the switching circuit is brought to a non-conductive state, keeping the switching circuit safe.

Instead of connecting the resistor in parallel to the Zener diode, a third P-channel MOS-FET may be additionally used in the switching circuit. In this case, a drain of the third MOS-FET is connected to the common gate junction Jg, its source is connected to the drain of the second MOS-FET, and its gate is connected to the drain of the first MOS-FET. A parasitic diode is included in the third MOS-FET, an anode of the parasitic diode being connected to the drain of the third MOS-FET and its cathode to the source of the third MOS-FET. When the gate voltage at the common gate junction becomes indefinite, while a high voltage is supplied to the output terminal and the input terminal at a low voltage, the third MOS-FET is turned on, and thereby the first and the second MOS-FETs are turned off. Thus, the switching circuit is brought to the non-conductive state, preventing a reverse current flowing from the output terminal to the input terminal.

According to the present invention, the switching circuit is kept non-conductive when the gate voltage becomes indefinite even if the output terminal is at a high voltage. This advantage is attained by simply adding a resistor or connecting a third MOS-FET to the conventional switching circuit. Other objects and features of the present invention will become more readily apparent from a better understanding of the preferred embodiments described below with reference to the following drawings.

DETAILED DESCRIPTION OF THE PREFERRED EMBODIMENTS

Figure 1:
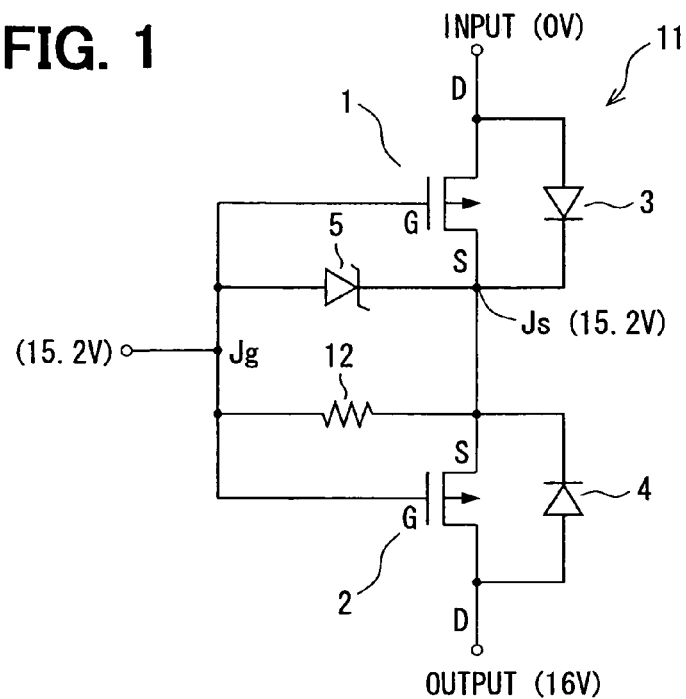
FIG. 1 is a circuit diagram showing a switching circuit as a first embodiment of the present invention.
Figure 3:
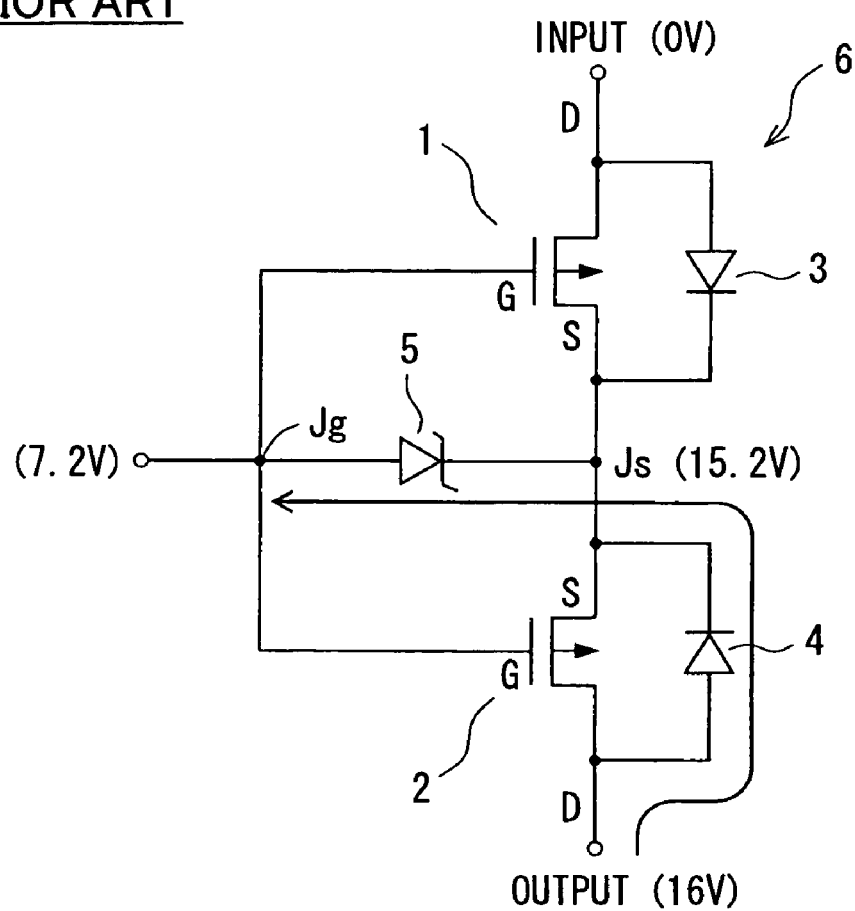
FIG. 3 is a circuit diagram showing a conventional switching circuit.

A first embodiment of the present invention will be described with reference to FIG. 1. In a switching circuit 11 shown in FIG. 1, a resistor 12 is connected in parallel to the Zener diode 5. Other structures are the same as those shown in FIG. 3. The source of the first MOS-FET 1 and the source of the second MOS-FET 2 is commonly connected to a source junction Js, and the gates of both the first and the second MOS-FETs 1, 2 are commonly connected to a gate junction Jg. Let's assume that the gate voltage becomes indefinite due to some accidental causes such as disconnection of a gate circuit under the condition that the input side is at zero volt while 16 volts are imposed on the output side. In this case, though the source voltage at Js becomes 15.2 volts, almost no gate current (except a very small amount of leakage current) flows through the gates of the MOS-FETs 1, 2 because the gate circuit is open. Accordingly, the gate voltage at Jg becomes equal to the voltage at Js through the resistor 12. As a result, the switching circuit 11 is brought to a non-conductive state without fail.

A CrSi resistor may be advantageously used as the resistor 12 from standpoints of its size and temperature characteristics. A diffusion resistor may be used as the resistor 12. The diffusion resistor is advantageous in suppressing a leakage current through the resistor 12 at a high temperature because a resistance of the diffusion resistor increases according to an ambient temperature.

As described above, the switching circuit 11 is brought to the non-conductive state without fail, when a high voltage is imposed on the output side and the input side is at a low voltage while the gate circuit becomes open. That is, a reverse current from the output side to the input side is surely prevented by simply connecting the resistor 12 in parallel to the Zener diode 5. In other words, a fail-safe is realized without enlarging the size of the switching circuit 11. This is particularly advantageous in suppressing a total circuit size when a switching circuit is selectively used from among plural switching circuits.

A second embodiment of the present invention will be described with reference to FIG. 2. In this embodiment, the resistor 12 used in the first embodiment is omitted. Instead, a third P-channel MOS-FET 14 is additionally used in the switching circuit 13. A drain of the MOS-FET 14 having a parasitic diode 15 is connected to the gate junction Jg, its source is connected to the drain of the second MOS-FET 2, and its gate is connected to the drain of the first MOS-FET 1. Accordingly, the parasitic diode 15 of the third MOS-FET 14 is connected in a reverse direction with respect to the parasitic diode 4 of the second MOS-FET 2. Other structures are the same as those of the first embodiment shown in FIG. 1.

When 16 volts are supplied to the source of the third MOS-FET 14 and zero volt is supplied to its gate, the third MOS-FET 14 is turned on. A voltage at the gate junction Jg is (16−Vds) volts, where Vds is a voltage between the drain and the source of the third MOS-FET 14. A voltage at the source junction Js is (16−Vf) volts, where Vf is a forward voltage of the parasitic diode 4. Therefore, a voltage between the source junction Js and the gate junction Jg is (Vds−Vf) Because the Vds is about 0.1 volt and Vf is about 0.8 volts, (Vds−Vf) becomes −0.7 volts. Accordingly, both of the first and the second MOS-FETs 1, 2 are turned off (a threshold voltage of each of the MOS-FETs 1, 2, and 3 is about 2.0 volts).

Figure 2:
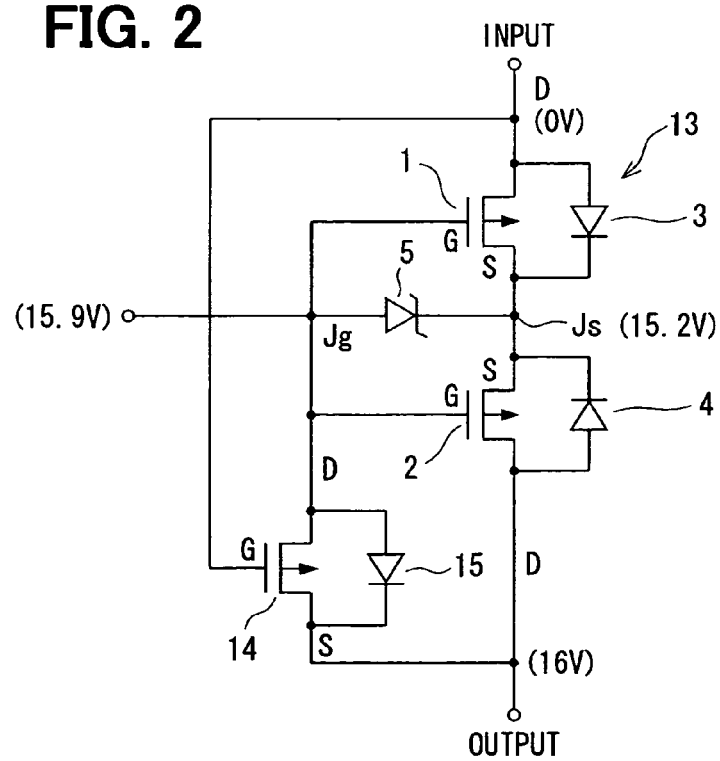
FIG. 2 is a circuit diagram showing a switching circuit as a second embodiment of the present invention.

By connecting the third P-channel MOS-FET 14 to the switching circuit 13 as shown in FIG. 2, the third MOS-FET 14 is turned on when the gates of the MOS-FETs 1 and 2 become open while a high voltage is supplied to the output side and a low voltage is supplied to the input side. Thus, the switching circuit 13 is brought to a non-conductive state, and the reverse current flowing from the output side to the input side is prevented without fail.

The present invention is not limited to the embodiments described above, but it may be variously modified. For example, The Zener voltage of the Zener diode, the withstanding voltage of the MOS-FETs or the voltage supplied to the switching circuit may be changed according to application and design needs.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A switching circuit comprising:
    a first P-channel MOS-FET;
    a second P-channel MOS-FET, both P-channel MOS-FETs being connected in series so that sources of both P-channel MOS-FETs are connected to a common source junction and cathodes of parasitic diodes of both P-channel MOS-FETs are also connected to the common source junction, gates of both P-channel MOS-FETs being connected to a common gate junction; and
    a Zener diode for protecting the P-channel MOS-FETs, connected between the common source junction and the common gate junction, wherein:
    both P-channel MOS-FETs are simultaneously turned on and off by controlling a voltage supplied to the common gate junction; and
    a third P-channel MOS-FET is connected in the switching circuit in such a manner that its drain and an anode of its parasitic diode are connected to the common gate junction, its source is connected to the drain of the second P-channel MOS-FET, and its gate is connected to the drain of the first P-channel MOS-FET, thereby bringing the switching circuit to a non-conductive state when a gate voltage supplied to the common gate junction becomes indefinite.

* * * * *